United States Patent [19]
Roane et al.

[11] Patent Number: 5,236,117
[45] Date of Patent: Aug. 17, 1993

[54] IMPACT SOLDER METHOD AND APPARATUS

[75] Inventors: Jerry M. Roane; Carmen D. Burns, both of Austin, Tex.

[73] Assignee: Staktek Corporation, Austin, Tex.

[21] Appl. No.: 903,056

[22] Filed: Jun. 22, 1992

[51] Int. Cl.$^5$ ............................................. B23K 3/00
[52] U.S. Cl. ......................... 228/180.21; 228/259; 228/9; 427/347; 427/433
[58] Field of Search ............ 427/347, 123, 433; 118/57, 423; 228/9, 37, 180.2, 219, 125, 259

[56] References Cited

U.S. PATENT DOCUMENTS

| | | | |
|---|---|---|---|
| 4,129,668 | 12/1978 | Rouquie | 118/423 |
| 4,501,770 | 2/1985 | Bajka et al. | 427/347 |
| 4,610,391 | 9/1986 | Nowotarski | 228/219 |
| 4,763,599 | 8/1988 | Tombs et al. | 118/57 |
| 4,775,776 | 10/1988 | Rahn et al. | 228/9 X |
| 4,799,616 | 1/1989 | Simpson et al. | 427/347 X |
| 5,121,875 | 6/1992 | Hagerty et al. | 228/219 |

FOREIGN PATENT DOCUMENTS

1807989  5/1970  Fed. Rep. of Germany ........ 228/37

Primary Examiner—Kenneth J. Ramsey
Attorney, Agent, or Firm—Fulbright & Jaworski

[57] ABSTRACT

A method and apparatus for tinning and soldering metal parts of electronic components and assemblies, and removing excess solder therefrom. The metal parts of the electronic components and assemblies are heated to a temperature near that of molten solder. A holding fixture, adapted to hold the heated components, slidably connects to an acceleration means which dips the metal parts of the components into the molten solder. Then acceleration energy is applied to the acceleration means, causing it to rapidly remove the components from the molten solder. Rapidly removing the components from the molten solder leaves excess solder behind, whereby all metal parts of the components are thoroughly tinned and soldered together without leaving unwanted solder bridges therebetween. A vibration means may also be used to prevent solder voids and promote solder wetting in densely packed leads and rails being tinned.

10 Claims, 9 Drawing Sheets

IMPACT SOLDER METHOD AND APPARATUS

BACKGROUND OF THE INVENTION

1. Field of the Invention

This invention relates to a method and apparatus for tinning and soldering metal parts of electronic components and assemblies, such as those involving integrated circuit packages, and removing excess solder therefrom, especially electronic components with frail leads and having a fine pitch thereto. In particular, the invention relates to dipping the metal parts of these electronic assemblies and components into molten solder and then rapidly removing them, whereby the metal parts are tinned and soldered without excess solder remaining on the metal parts and unwanted solder bridges therebetween.

2. Discussion of the Related Technology

Packaging techniques for electronic systems have been developed in the past in an attempt to satisfy demands for miniaturization in the semi-conductor industry. Improved methods of miniaturization in fabricating integrated circuits enables the integration of millions of transistor circuit elements onto single integrated silicone-embodied circuits, or chips, which have resulted in increased emphasis on apparatus and methods to package these circuits in space-efficient, yet reliable and mass-producible packages.

The semiconductor industry, having the ability to manufacture complex and sophisticated integrated chips, desires to take advantage of the packaging density possibilities of these integrated circuit chips. The sophisticated technology of today's integrated circuit chips has challenged the packaging abilities of conventional mechanical designs. Integrated circuit package technology has evolved in order to keep pace with complex integrated circuit chip interconnection requirements and, in addition, for efficient transfer and dissipation of heat generated by the integrated circuit chip contained therein. New methods for packaging complex integrated circuit chips have, for example, been disclosed in U.S. Pat. application Ser. No. 07/561,417, filed Aug. 1, 1990 by Burns and incorporated herein by reference for all purposes.

Fabrication of electronic systems may require connecting together hundreds of electronic components such as resistors, capacitors, transistors and integrated circuits. Presently, printed circuit boards are utilized as a structural base and interconnection system for these components. Electrical connection and partial mechanical connection may be obtained by means of soldering. Solder may be, for example, silver alloys, tin alloys and lead alloys or combinations thereof, such as tin/lead, tin/silver and tin/antimony. Solder is formulated to melt at a specific temperature. Solder may be used to attach various types of metal together and produce a low-ohmic resistance connection therebetween. Soldering of these components may be done by hand by applying a soldering iron and flux core solder to the area to be soldered. In hand soldering, each electrical connection must be soldered one solder joint at a time. Repetitively soldering each connection may unduly heat cycle the electronic part, causing failures later and, furthermore, is susceptible to inadvertent human error resulting in cold solder joints.

Wave soldering is an improvement over hand soldering when applied to a printed circuit board requiring numerous solder connections. A wave soldering station has molten solder continuously pumping through a plenum to expose un-oxidized solder. A printed circuit board and its pre-loaded components have flux supplied to the soldering area via a flux bubbler. The solder area of the printed circuit board is preheated, then the connection area of the printed circuit board is run through the molten solder and is slowly conveyed out of the solder wave and allowed to cool. A problem with wave soldering of printed circuit boards and/or complex electrical components is the possibility of excess solder buildup and resulting solder bridges between connections. This bridging problem is controllable only if there is sufficient clearance between the connections being soldered. Hot air knives have been used to remove excess solder but the high velocity air can damage the frail leads of the electronic components.

Another method is Pre-formed soldering, which uses solder and flux preformed into a shape that fits around the electronic component area to be soldered. The component to be soldered and the pre-form solder/flux are placed in an oven and heated. The solder melts and wicks around the metal parts of the electronic component, thus, making a solder connection. Soldering may also be done by electroplating a heavy coating of solder onto both parts to be connected and then applying heat to reflow the solder between these parts.

Yet another method of reflow soldering is vapor phase, which uses a special chemical that is heated to its boiling point. The boiling point of this chemical is at the correct temperature to melt the solder. The component assembly to be soldered is covered with solder paste or preformed solder and flux, then the assembly is lowered into the vapors of the boiling chemical, thus, melting the solder which reflows and makes electrical connections.

Other methods of soldering may be by infrared radiation, lasers, heat lamps, etc. All of the above methods of soldering melt and reflow solder when joining two or more metal electrical connections.

In all of the above methods of soldering, a problem exists when the component metal connections are very closely spaced together. Soldering tends to flow over metal and form a layer thereon. When the distance between metal connections is small enough the solder layer will tend to build up and bridge over between these minimally-spaced metal connections. Solder bridges cause unwanted short circuit conditions and renders the electronic component inoperative in the system. When the electronic component lead conductors are strong and large enough to withstand a blast of hot air, an air knife may be used to clean off any excess solder buildup and/or solder bridges between electrical conductors. With the newer ultra compact integrated circuit packages, however, the clearance of these metal conductors can be too small to effectively use known techniques of remedying bridging between conductors. In addition, the leads of these high density packages are extremely delicate and cannot tolerate the physical forces that result from the use of a hot air knife. Connection complexity, minimal clearances due to high packaging densities and fragile connection leads require a new way of soldering.

SUMMARY OF THE INVENTION

The present invention provides a method and apparatus for soldering electrical and mechanical connections of high density electronic packages without excess heat being applied to the internal components, reduces thermal stresses caused by large temperature excursions, eliminates excess solder buildup and bridging, and applies minimal physical stress on delicate metal lead connections. The present invention is adapted for efficiently and economically soldering delicate electronic components such as, for example, a three dimensional assembly of ultra thin integrated circuit packages (hereinafter referred to as a stack), without damage or excessive stress thereto. Various stacks are more fully illustrated in U.S. Pat. application Ser. No. 07/561,417 by Burns, filed Aug. 1, 1990, entitled "Ultra High Density Integrated Circuit Packages Method and Apparatus", and incorporated herein by reference for all purposes.

The present invention, for example, assembles a stack of ultra thin integrated circuit packages in a spring loaded shuttle carrier made up of thermally conductive material. The shuttle, holding the integrated circuit packages, is pushed (indexed) through a fluxing station where flux is applied to the lower exposed portion of the metal parts to be soldered. Next, the shuttle indexes across a preheater block where package temperature is raised in controlled stages at each preheat temperature index position. By indexing through each preheater block temperature zone, an exact preheat temperature profile is obtained. Use of controlled heating minimizes thermal stress within the integrated circuit packages. Cartridge heating elements and thermocouples placed into machined holes in the preheater shuttle block allow precise alignment with easy fabrication.

Indexing of the shuttle may be accomplished with air piston-cylinders. Travel of the air cylinders may be monitored with electrical or pneumatic switches mounted to the exterior of each indexing cylinder. The indexing process may be monitored and controlled by a programmable controller. This programmable controller can automate the operational steps of the present invention. The indexer system may also be comprised of a stepper motor, and chain or belt. When the metal parts of the integrated circuit packages reach the final predip temperature, the indexer will move the shuttle onto an impact arm which is used to actually dip the metal parts of the packages into molten solder.

In the method and apparatus of the present invention, the metal parts of the electronic packages are dipped into molten solder then withdrawn rapidly. A combination of solder surface tension and the acceleration resulting from rapidly removing the solder-dipped metal parts from the molten solder causes all excess solder to detach from these metal parts and fall back into the molten solder. The result is a smooth, even tinning and soldering of all metal parts dipped into the molten solder without the presence of excess solder buildup or solder bridges. Applying a mechanical vibration to the solder-dipped metal parts during solder dipping and removal eliminates small areas of insufficient solder coating on components or stacks with closely spaced leads or rails, respectively.

The closely spaced leads or rails of the electronic components or stacks, respectively, are extremely frail and can be easily damaged during soldering and cleaning operations. The present invention does not damage frail leads or rails because the acceleration imparted is in the direction perpendicular to the frail leads or rails and in which the leads have the most structural strength. Any electronic component, package, assembly or stack may be solder tinned by the apparatus and method of the present invention. The present invention is especially useful for tinning densely packed frail leads that would not survive the forces applied by a hot air knife.

An impact arm is used to dip the parts as described above. This impact arm may be pivotally connected to a base wherein movement is in a vertical plane. The arm, holding the shuttle, is lowered toward the molten solder, coming to rest against a height stop which may be adjusted to regulate the distance that the packages are dipped into the molten solder. After a predetermined time, the arm is rapidly moved in the upward direction by an impact weight falling onto the top of the arm end opposite the shuttle.

The impact weight is raised above the opposite end of the arm to a height which may be, for example, determined by a limit switch on an air cylinder actuator. A timer in the programmable controller determines the length of time that the packages remain in the molten solder. When this timer times out, the impact weight is allowed to fall and impact the opposite end of the arm. The weight, impacting the opposite end of the arm, accelerates the shuttle containing the packages out of the molten solder and back in line with the preheater block for further indexing.

The rapid acceleration caused by the sudden movement of the shuttle out of the molten solder results in substantially all of the excess solder dropping off of the metal parts of the integrated circuit packages and falling back into the molten solder fountain. When excess solder does not remain on the parts being soldered, solder bridges cannot form.

The impact arm may also be rapidly moved by electromagnetic means such as, for example, an electromagnetically operated solenoid that may either push or pull on the impact arm. The solenoid may be placed between the impact arm pivot and shuttle or it may be at the arm end opposite the shuttle.

After the rapid removal from the molten solder, the shuttle is indexed off of the arm onto a post heater. The post heater allows a controlled temperature cool down of the integrated circuit packages just soldered. This controlled cool down reduces the thermal stresses on the integrated circuit packages. After cool down, the partially soldered packages are cleaned and the other side of the package may be soldered repeating the steps above.

Instead of having to remove the shuttle from the arm as described above, the arm may be adapted to rotate in increments of 90 or 180 degrees so that each face of the integrated circuit package may be soldered sequentially. This reduces the number of temperature cycles the packages must be subjected to during the preheat and dipping cycles.

A carrier rail may be used to hold the electronic packages to be soldered and may be used, additionally, to pre-heat the packages to a temperature slightly below that of the molten solder. This temperature pre-heating reduces the thermal stresses when the package is dipped into the molten solder. An electronic package or a stack thereof may be dipped into the molten solder by means of a holder attached to an arm pivotally mounted on a base in alignment with a molten solder fountain. A guide stop may be used to regulate the distance that the package is dipped into the molten solder. An electronic package may be, for example, placed in the solder fountain for approximately 2 to 8 seconds, then a force such as a weight may be used to rapidly accelerate movement of the arm causing the removal of the electronic package perpendicular to the molten solder. As the package rapidly accelerates out of the molten solder, all excess solder falls off and drops back into the molten solder fountain. Trailing solder droplets are avoided by the rapid movement of the package out of the way of the falling droplets.

Use of a nitrogen shroud around the packages eliminates having to put flux on the package before soldering. A nitrogen shroud prevents oxidation from forming on the metal parts of the packages because substantially no oxygen is present.

Another embodiment of the present invention allows a pre-soldered electronic package to be heated to the point of solder reflow and then by impacting the package, remove all excess molten solder therefrom. For example, an electronic package covered with excess solder may be heated to the point of solder reflow in a nitrogen-filled oven and a robotics arm would accelerate the package until halted by a stop block. The sudden stopping of the package causes substantially all excess solder to be hurled off of the package, thus, leaving clean tinned metal surfaces without excess solder and resulting solder bridges therebetween. Rapidly accelerating the package in a nitrogen-filled oven in the direction of each face until halted by a corresponding stop block effectively and rapidly cleans the entire electronic package of substantially all of the excess solder. Any number of electronic packages, mounted together in a shuttle, may be soldered by the method and apparatus of the present invention.

An object of the present invention is to solder electronic packages and components without excess solder buildup and resultant solder bridges, and to provide a strong uniform solder connection.

A further object of the present invention is to solder large lots of electronic packages at one time without excess solder buildup and resultant solder bridges.

Another object of the present invention is to solder together integrated circuit stacks comprising a large number of leads.

Yet a further object of the present invention is to reduce thermal stresses on electronic packages being soldered.

An object of the present invention is to tin and solder metal parts of an electronic assembly and remove excess solder therefrom by applying a flux to the metal parts of the assembly, heating the metal parts of the assembly to a temperature near that of molten solder, dipping the metal parts of the assembly into molten solder, and removing the metal parts from the molten solder, rapidly.

A further object of the present invention is to tin and solder metal parts of an electronic assembly and remove excess solder therefrom while in a nitrogen blanket by heating the metal parts of the assembly to a temperature near that of molten solder, dipping the metal parts of the assembly into molten solder, and removing the metal parts from the molten solder, rapidly.

Yet a further object of the present invention is to remove excess solder from electronic assemblies in a heated nitrogen blanket by heating the metal parts of an electronic assembly until the excess solder reflows, moving the heated assembly on an accelerating arm until it stops against a stop whereby excess solder is thrown off of the metal parts.

Still a further object of the present invention is to remove excess solder from electronic assemblies in a heated nitrogen blanket by heating the metal parts of an electronic assembly until the excess solder reflows, moving the heated assembly on an accelerating arm until it stops against a stop in the direction of each side of the assembly whereby excess solder is thrown off of the metal parts.

A further object of the present invention is an apparatus for tinning and soldering metal parts of an electronic assembly and removing excess solder therefrom by using a solder flux applicator which applies solder flux to the metal parts of the electronic assembly, a heater for heating the metal parts of the electronic assembly to a temperature near that of molten solder, a holding fixture to hold the electronic assembly, the holding fixture used to dip the metal parts of the electronic assembly into the molten solder and the holding fixture used to rapidly remove the electronic assembly from the molten solder whereby excess solder does not remain on the metal parts of the electronic assembly.

Another object of the present invention is an apparatus for tinning and soldering metal parts of an electronic assembly and removing excess solder therefrom by using a solder flux applicator to apply solder flux to the metal parts of the electronic assembly, a preheater to heat the metal parts of the electronic assembly to a temperature near that of molten solder, a holding fixture for holding the electronic assembly, the holding fixture may slidably connect with an acceleration means that holds the fixture and a means for receiving acceleration energy. The acceleration means is used to dip the metal parts of the electronic assembly into the molten solder. When acceleration energy is received by the acceleration means, it rapidly removes the metal parts of the electronic assembly from the molten solder in such a way that excess solder does not remain on the metal parts of the electronic assembly.

DETAILED DESCRIPTION OF THE PREFERRED EMBODIMENT

A typical soldering operation using the method and apparatus of the present invention is to (1) apply flux to the electronic packages, (2) pre-heat, (3) dip into molten solder, and (4) rapidly remove from the molten solder, thus, cleaning and removing any excess solder thereon. For multi-sided packages, these steps may be repeated for each side of the electronic package to be so soldered. A better understanding of the present invention will be obtained when the following detailed description is read with reference to the drawings wherein common elements are designated with like numbers or letters and similar elements are designated with like numbers followed by a lower case letter.

Figure 1:
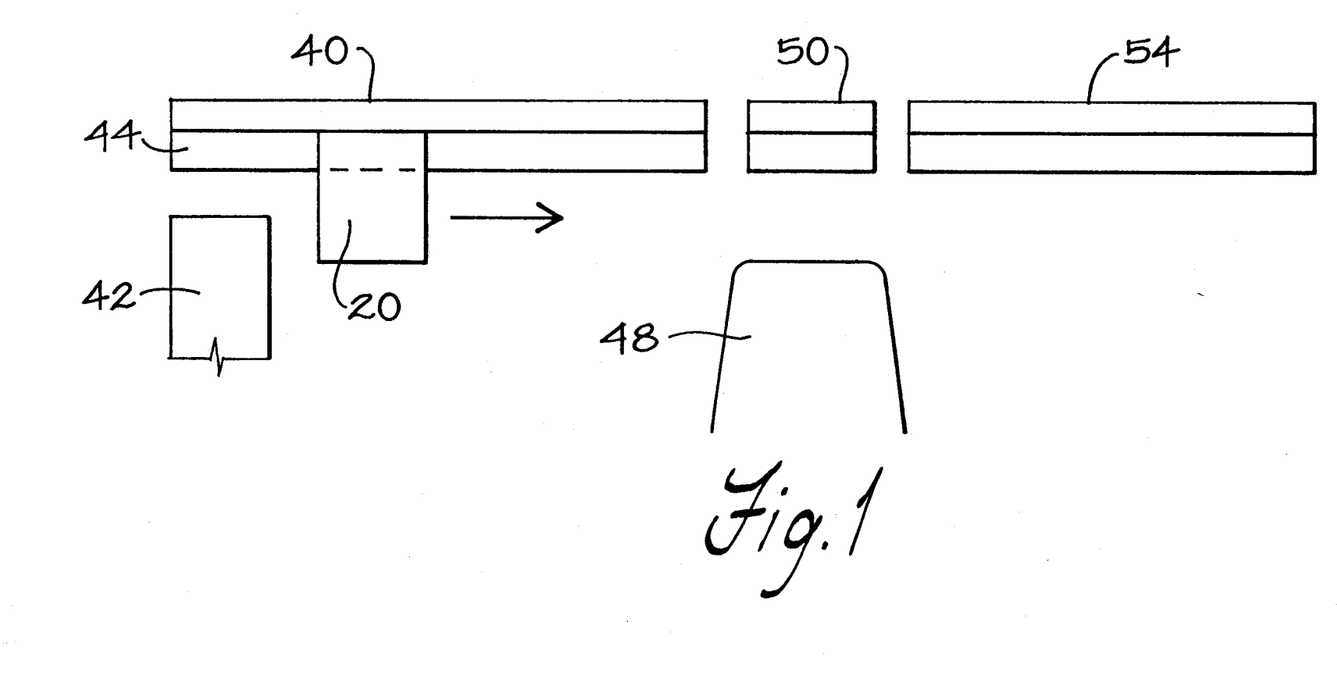
FIG. 1 illustrates a schematic block diagram of the present invention.
Figure 2:
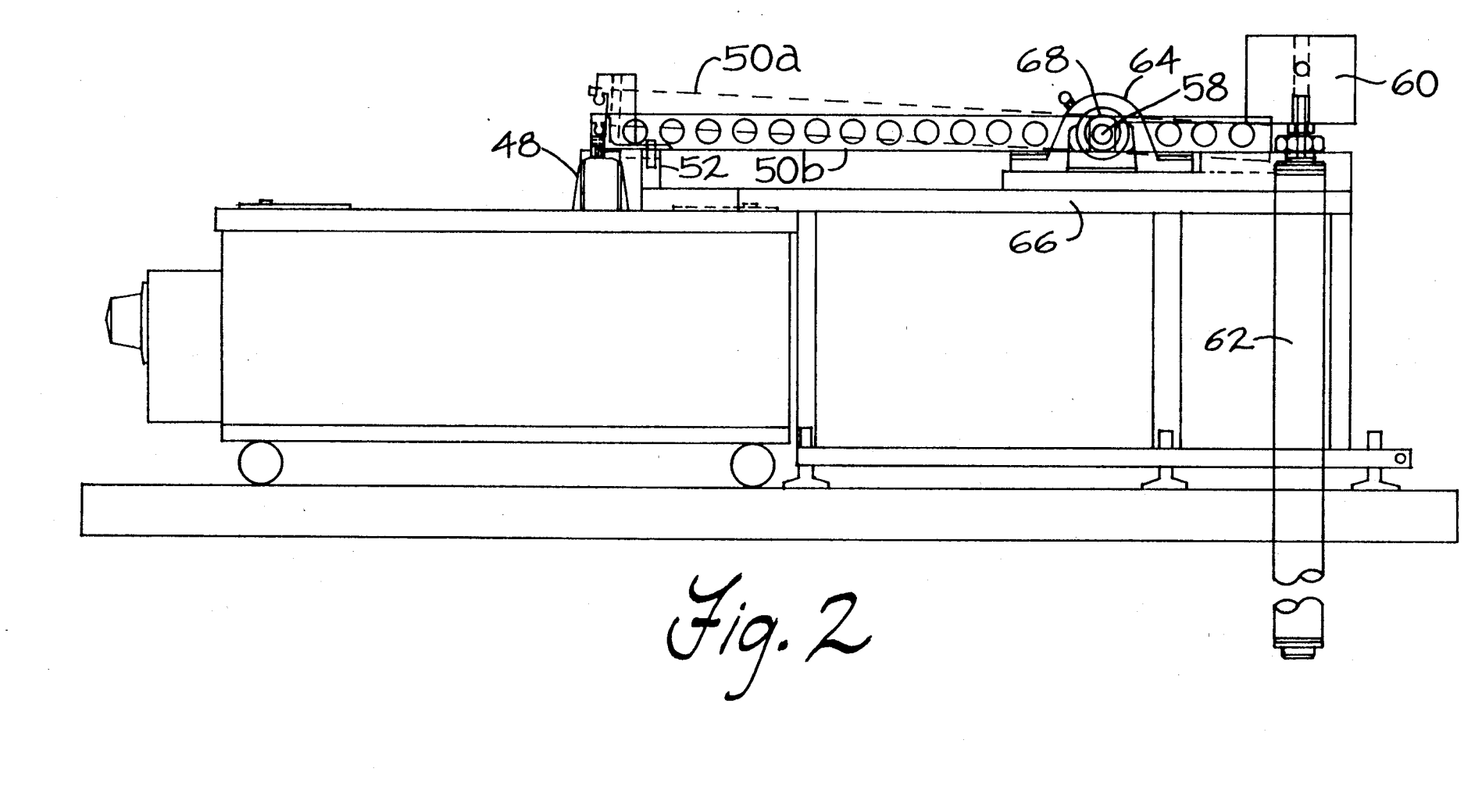
FIG. 2 illustrates a schematic elevational view.
Figure 3:
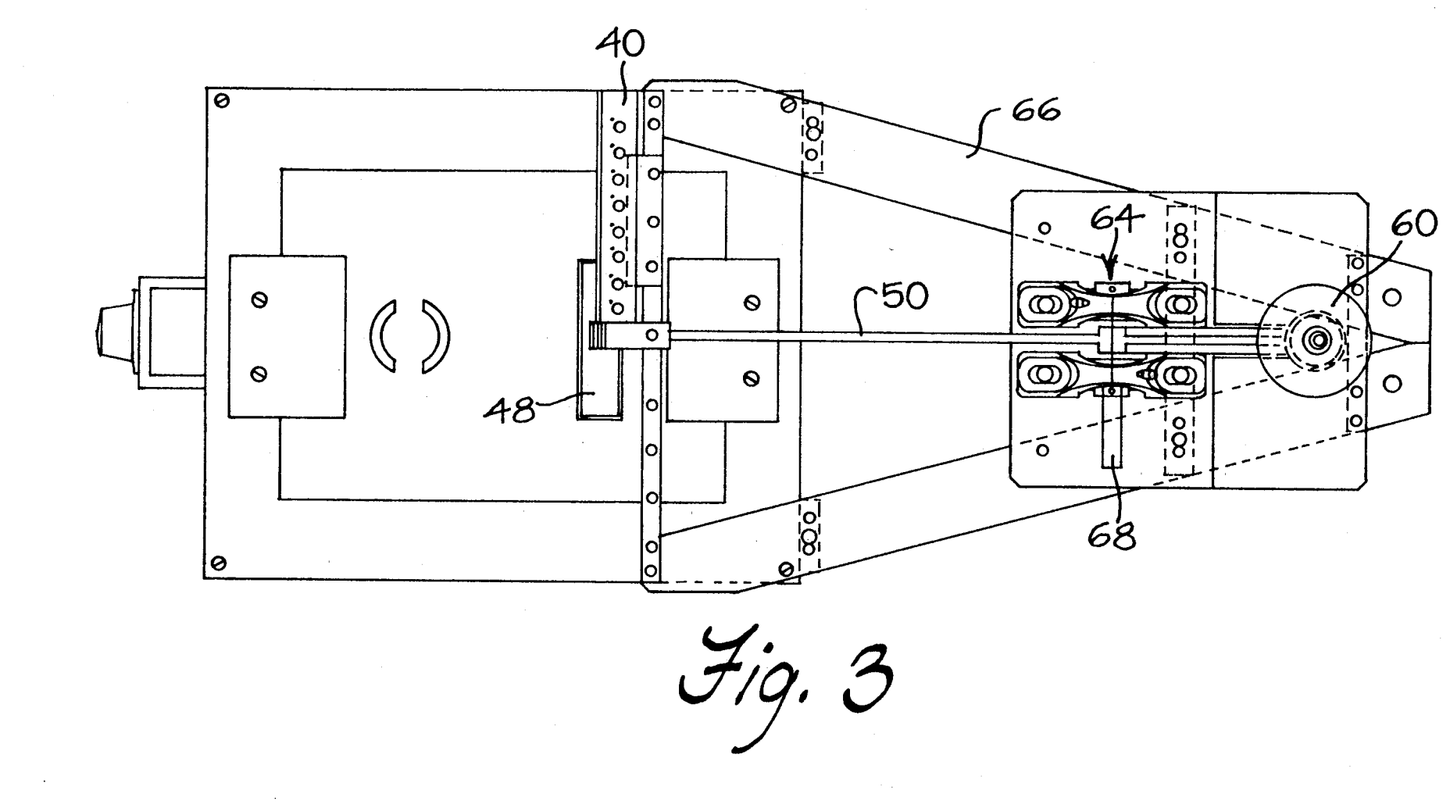
FIG. 3 illustrates a schematic plan view.

Referring now to FIG. 1, a schematic block diagram of the present invention is illustrated. The present invention comprises a spring loaded shuttle carrier assembly 20, a fluxing station 42, a preheater block 40, an impact arm 50, a molten solder fountain 48, and a post heater block 54. Referring also to FIGS. 2 and 3, the present invention additionally comprises impact weight 60, impact weight air cylinder 62, pivot assembly 64, and height stop 52 adjusted by height adjustment screw 53.

Figure 6:
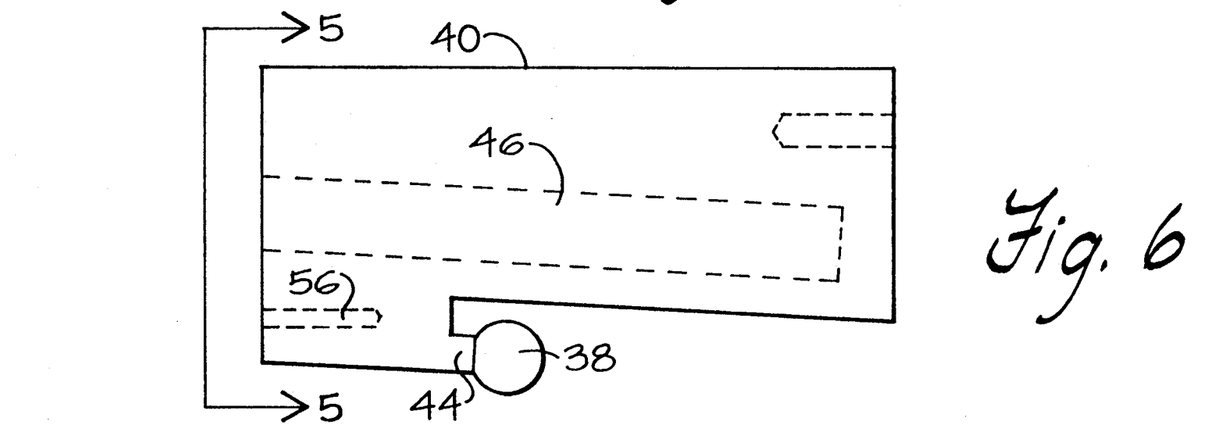
FIG. 6 illustrates an end view of FIG. 5.

An electronic assembly 22 (FIG. 7), such as stacked ultra thin integrated circuits packages, is assembled with the leads 24 to be soldered exposed on one end and touching a thermal block 26. The thermal block 26 and assembly 22 are held in a spring loaded shuttle 20. Spring loaded shuttle 20 is comprised of a shuttle body 30, shuttle gripper 28, spring 32 and screw 34. Within body 30 is a female quick connector 36 which slidingly engages a male quick connector 38 (FIG. 6).

Figure 5:
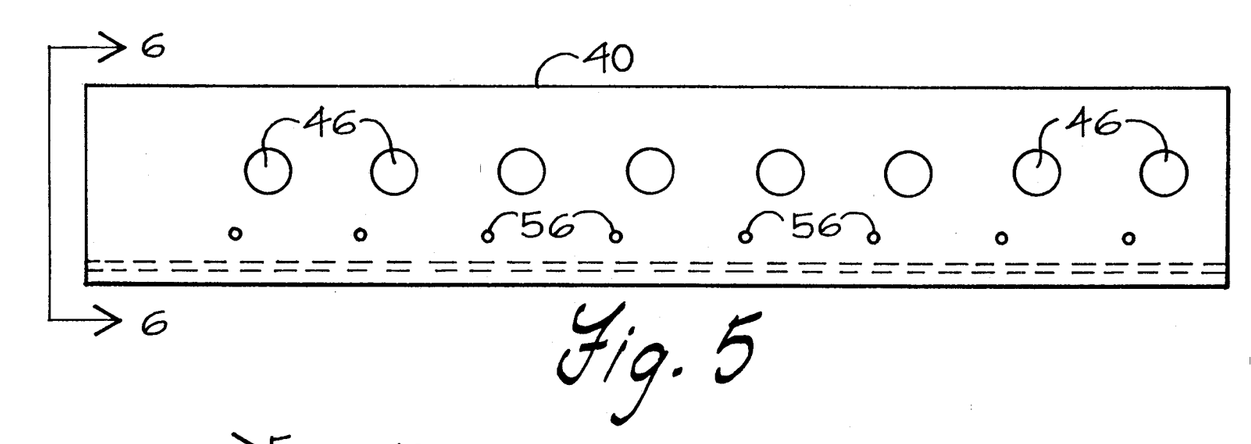
FIG. 5 illustrates a partial schematic elevation view of a preferred embodiment.

Shuttle 20 is in thermal contact with preheater block 40 and guided along preheater block shaft 44 (FIG. 1). Shaft 44 has a connector 38 (FIG. 6) which slidingly engages connector 36 (FIG. 8), thus, holding shuttle 20 in close communication with the heater block 40. Preheater block 40 has machined wells for the insertion of heating elements and thermocouples. FIGS. 5 and 6 illustrate the heater block 40, heating element wells 46, thermocouple wells 56, quick connector 38 and block shaft 44. Heating elements and thermocouples (not illustrated) are staged to generate and control by means, for example, of a programmable controller (not illustrated), the temperature of preheater block 30 in closely regulated steps.

Shuttle 20 is guided by and moves along shaft 44 at discrete distances and time intervals. This movement or indexing may be accomplished with an indexing system (not shown) such as air piston-cylinders or stepper motors using chain or belt drive, as is well known in the art of robotics and automation. As shuttle 20 moves along block 40, heat is conducted through the metal shuttle body 30 into the thermal block 36 which thermally conducts the heat directly to metal leads 24 of the electronic package 22 to be soldered. When the leads 24 reach a temperature slightly below that of the molten solder, then the package 22 is ready to be soldered. The present invention gradually brings the package 22 up to approximately the temperature of the molten solder to minimize thermal shock. After the package 22 is dip soldered, a post heater block 54 (FIG. 1) may be used to gradually and controllably cool down the soldered package 22. The post heater block 54 functions in the same manner as the preheater block 40. The fluxing station 42 may apply flux to leads 24 for oxidation removal during the soldering operation. An alternate to fluxing the leads 24 is to run the present system of the invention in a nitrogen blanket which excludes oxygen, thus preventing heat oxidation of the metal leads 24.

Figure 4:
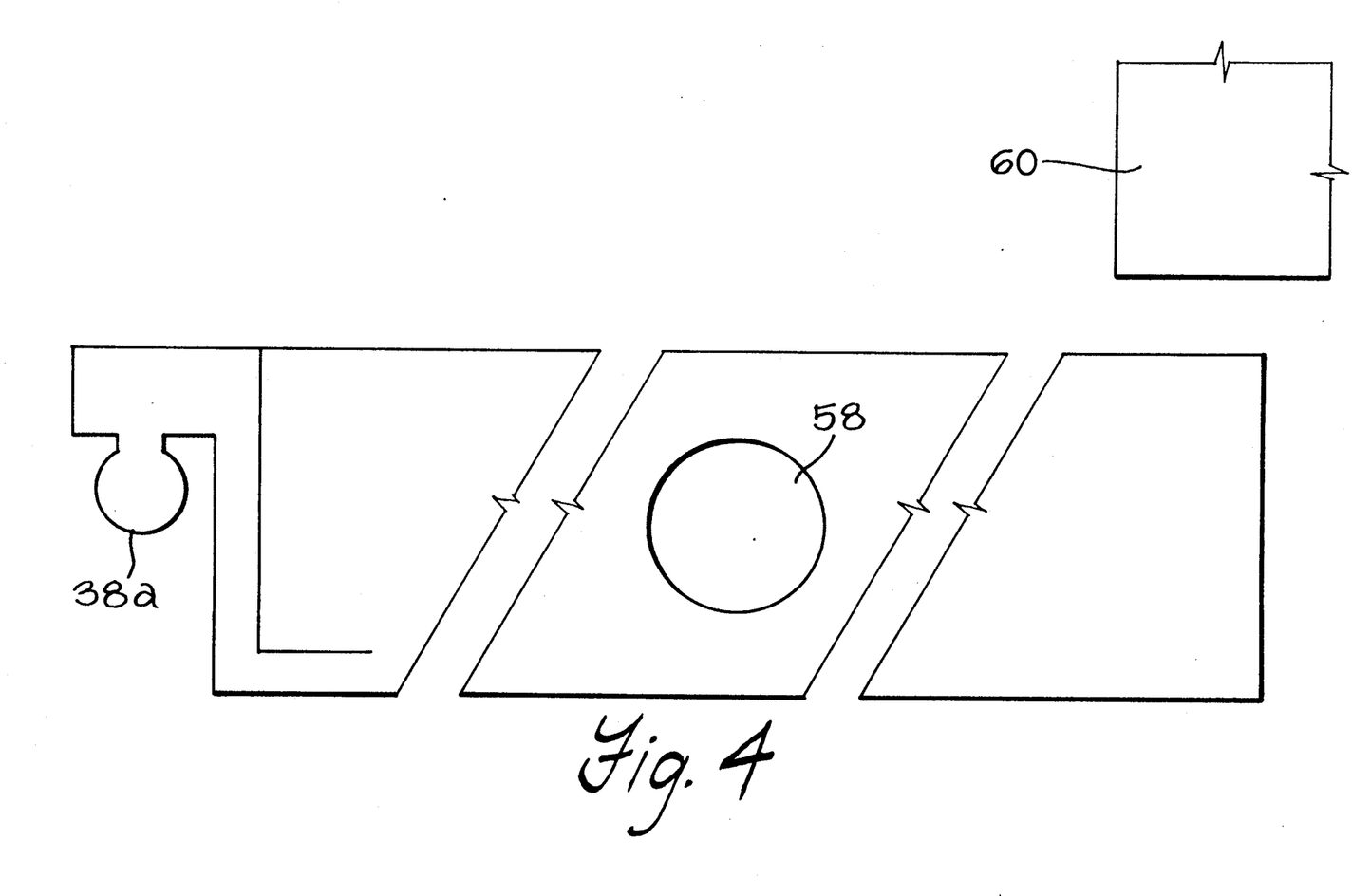
FIG. 4 illustrates a partial schematic elevational view of a preferred embodiment of the present invention.
Figure 7:
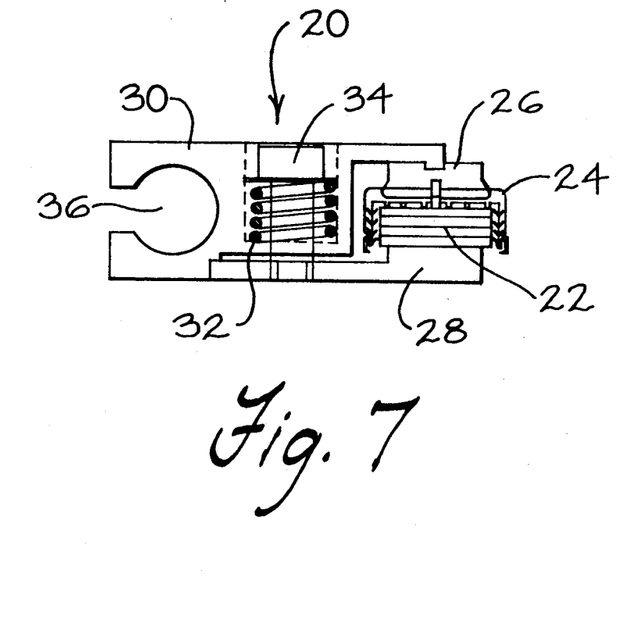
FIG. 7 illustrates a partial schematic elevational view of a preferred embodiment.
Figure 8:
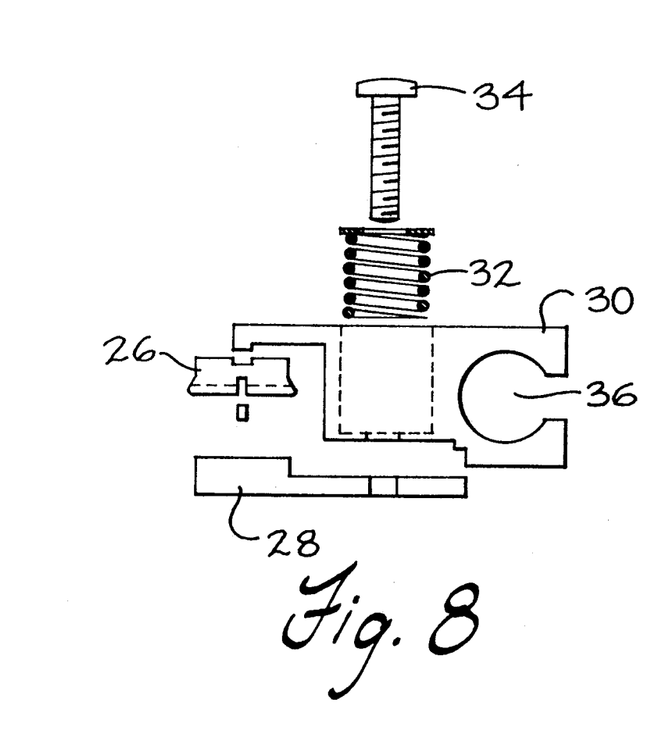
FIG. 8 illustrates an exploded schematic elevational view of FIG. 7.
Figures 9B, 9D:
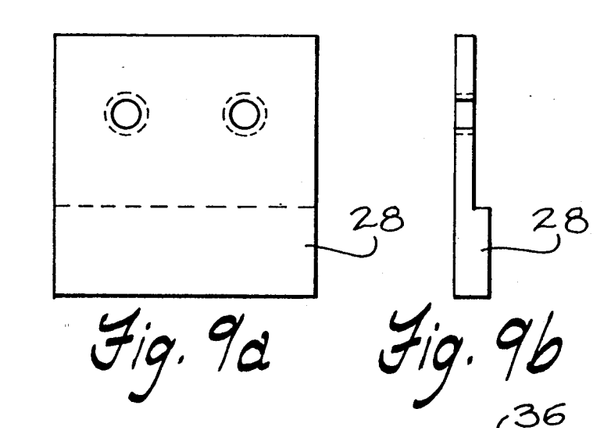
FIG. 9 illustrates a partial schematic plan and side view of part of FIG. 8.
Figure 10B:
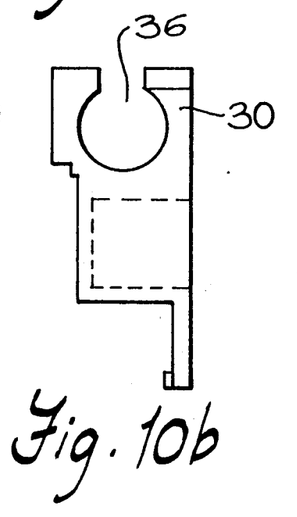
FIG. 10 illustrates a partial schematic top and bottom plan views, and side view of part of FIG. 8.
Figure 10C:
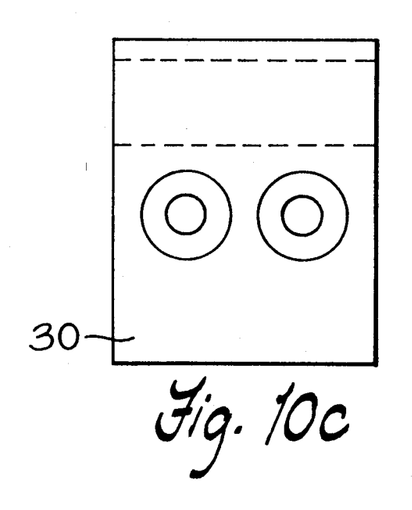
Figure 10D:
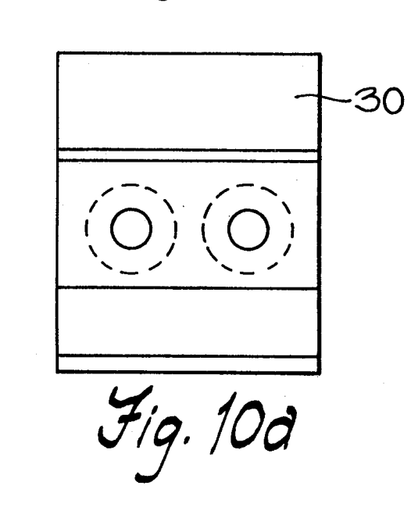
Figure 11:
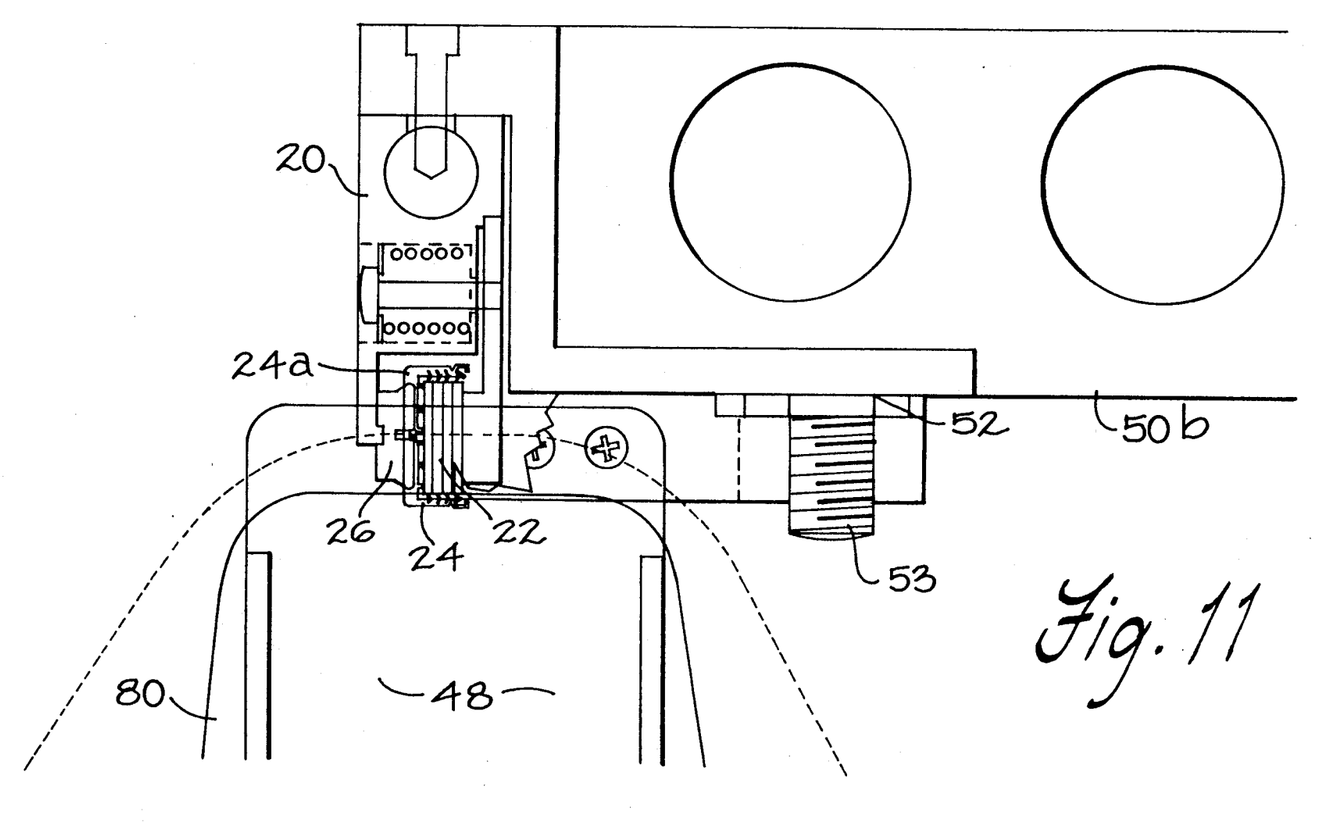
FIG. 11 illustrates a partial schematic elevational view of a preferred embodiment of the present invention.

FIG. 2 illustrates the impact arm 50a in a raised position and impact arm 50b in the lowered position. The impact arm 50 is pivotally mounted on pivot assembly 64 through pivot hole 58 (FIG. 4). The pivot assembly 64 is fixedly attached to base 66. The arm 50 has a quick connector 38a (FIG. 4) for slidingly engaging the female quick connector 36 in shuttle body 30 (FIGS. 7 and 8). Once the temperature of the package 22 is heated within, for example, 20 to 40 degrees of the temperature of the molten solder, the indexing system (not shown) moves the shuttle 20 onto the impact arm 50. Impact arm 50 moves to its lower position (FIG. 2, arm 50b) and is stopped by height stop 52. Height stop 52 is set by height adjustment screw 53 so that just the metal leads 24 of the package 22 are dipped into the molten solder 80 of fountain 48 as illustrated in FIG. 11. A vibration means 68 may be used to vibrate the impact arm 50, giving the package 22 a mechanical vibration. This mechanical vibration is useful in preventing solder voids or lack of solder tinning of closely spaced leads or rails.

After a predetermined time, impact weight 60 drops onto the top of the opposite end of arm 50 (FIG. 2), rapidly moving (impacting) it to an upper position illustrated as arm 50a. Movement of weight 60 is controlled by air cylinder 62 which in turn may be controlled by a programmable controller (not shown). The acceleration resulting from this rapid upper movement of the arm 50 causes substantially all of the excess molten solder to be removed from the leads (rails) 24 and back into the molten solder 80. Without excess solder buildup the possibility of solder bridges is greatly reduced. Vibrational energy applied to the package 22 during dipping into the solder fountain 48 and removal therefrom, substantially removes all excess solder and, in addition, eliminates unsoldered voids in the tightly spaced leads (rails) 24.

Figure 2A:
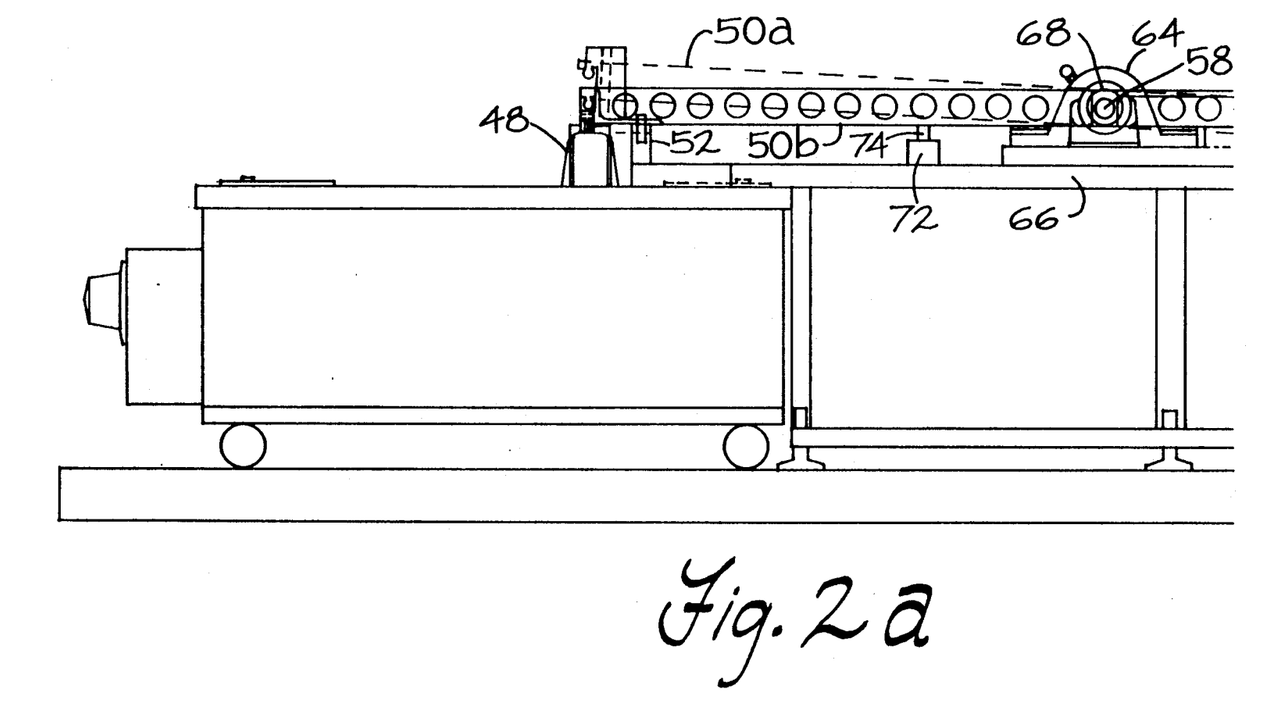
FIG. 2a illustrates a schematic elevational view of an alternative embodiment of the present invention.

An alternative embodiment of the present invention is illustrated in FIG. 2a. An electromagnetically operated solenoid 72 raises the impact arm 50 by means of plunger 74. The plunger 74 rapidly extends from the solenoid 72 when electrical power is applied thereto. The solenoid 72 may be controlled by the programmable controller (not shown) which may control the sequence of the steps in the method and apparatus of the present invention.

After the dip and impact operations of the present invention, the shuttle 20 may be indexed to the post heater 54 where package 22 may be cooled in a controlled manner to reduce thermal stresses thereon. After cooling, the package 22 may be reversed for soldering of the leads 24a on the other side of the package 22. Soldering of the other side of package 22 comprises a repetition of the above described steps.

The foregoing disclosure and description of the invention are illustrative and explanatory of the preferred embodiments, and changes in the size, shape, materials and individual components, circuit elements, connections and construction may be made without departing from the spirit of the invention.

What is claimed is:

1. An apparatus for tinning and soldering metal parts of an electronic assembly and removing excess solder therefrom, comprising:
   a solder flux applicator, said applicator applying solder flux to the metal parts of the electronic assembly;
   a heater adapted to heat the metal parts of the electronic assembly to a temperature near that of molten solder, wherein said heater is a thermally conductive block of material having heating elements and temperature sensing devices embedded linearly within said conductive block, said sensing devices used to control the temperatures of said heating elements;

a holding fixture adapted for holding the electronic assembly;

said holding fixture adapted to dip the metal parts of the electronic assembly into molten solder; and said holding fixture adapted to rapidly remove the electronic assembly from said molten solder whereby excess solder is substantially removed from the metal parts of the electronic assembly.

2. An apparatus for tinning and soldering metal parts of an electronic assembly and removing excess solder therefrom, comprising:

a solder flux applicator, said applicator applying solder flux to the metal parts of the electronic assembly;

a preheater adapted to heat the metal parts of the electronic assembly to a temperature near that of molten solder;

a holding fixture adapted for holding the electronic assembly;

an acceleration means;

an impact arm adapted to hold said fixture and be rapidly moved by said acceleration means;

said holding fixture adapted to slidably connect with said impact arm;

said impact arm adapted to dip the metal parts of the electronic assembly into molten solder; and said acceleration means adapted to rapidly move said impact arm whereby the metal parts of the electronic assembly are rapidly removed from said molten solder without excess solder remaining on the metal parts of the electronic assembly.

3. The apparatus of claim 2, wherein the acceleration means is an impact weight.

4. The apparatus of claim 2, wherein the acceleration means is an electromagnetic solenoid.

5. A method of tinning and soldering metal parts of an electronic assembly and removing excess solder therefrom, comprising the steps of:

applying solder flux to the metal parts of the electronic assembly with a solder flux applicator;

heating the metal parts of the electronic assembly to a temperature near that of molten solder with a heater, wherein said heater is a thermally conductive block of material having heating elements and temperature sensing devices embedded linearly within said conductive block, said sensing devices used to control the temperatures of said heating elements;

holding the electronic assembly with a holding fixture, wherein said holding fixture is adapted to dip the metal parts of the electronic assembly into molten solder; and rapidly removing the electronic assembly from molten solder with the holding fixture whereby excess solder is substantially removed from the metal parts of the electronic assembly.

6. A method of tinning and soldering metal parts of an electronic assembly and removing excess solder therefrom, comprising the steps of:

applying solder flux to the metal parts of the electronic assembly with a solder flux applicator;

heating the metal parts of the electronic assembly to a temperature near that of molten solder with a preheater;

holding the electronic assembly with a holding fixture;

slidably connecting said holding fixture to an impact arm;

moving said impact arm to dip the metal parts of the electronic assembly into molten solder; and rapidly accelerating said impact arm whereby the metal parts of the electronic assembly are rapidly removed from the molten solder without excess solder remaining on the metal parts of the electronic assembly.

7. The method of claim 6, wherein the step of accelerating said impact arm is with an impact weight.

8. The method of claim 6, wherein the step of accelerating said impact arm is with an electromagnetic solenoid.

9. A method of tinning and soldering metal parts of an electronic assembly and removing excess solder therefrom, comprising the steps of:

applying solder flux to the metal parts of the electronic assembly with a solder flux applicator;

heating the metal parts of the electronic assembly to a temperature near that of molten solder with a heater;

holding the electronic assembly with a holding fixture, wherein said holding fixture is adapted to dip the metal parts of the electronic assembly into molten solder;

rapidly removing the electronic assembly from the molten solder with the holding fixture whereby excess solder is substantially removed from the metal parts of the electronic assembly; and cooling the electronic assembly at a controlled temperature rate with a post heater.

10. An apparatus for tinning and soldering metal parts of an electronic assembly and removing excess solder therefrom, comprising:

a solder flux applicator, said applicator applying solder flux to the metal parts of the electronic assembly;

a heater adapted to heat the metal parts of the electronic assembly to a temperature near that of molten solder;

a holding fixture adapted for holding the electronic assembly;

said holding fixture adapted to dip the metal parts of the electronic assembly into molten solder;

said holding fixture adapted to rapidly remove the electronic assembly from molten solder whereby excess solder is substantially removed from the metal parts of the electronic assembly; and a post heater for cooling the electronic assembly at a controlled temperature rate.

* * * * *